(12) United States Patent
Kelly

(10) Patent No.: US 7,868,472 B2
(45) Date of Patent: Jan. 11, 2011

(54) THERMAL DISSIPATION IN INTEGRATED CIRCUIT SYSTEMS

(75) Inventor: Michael G. Kelly, Corvallis, OR (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 1316 days.

(21) Appl. No.: 10/820,484

(22) Filed: Apr. 8, 2004

(65) Prior Publication Data

US 2005/0224954 A1     Oct. 13, 2005

(51) Int. Cl.
      *H01L 23/28*    (2006.01)
(52) U.S. Cl. .................. 257/796; 257/690; 257/707
(58) Field of Classification Search ......... 257/787–796, 257/690, 706–707
See application file for complete search history.

(56) References Cited

U.S. PATENT DOCUMENTS

| | | | |
|---|---|---|---|
| 5,027,189 A | 6/1991 | Shannon et al. | |
| 5,143,865 A * | 9/1992 | Hideshima et al. | 438/614 |
| 5,156,998 A | 10/1992 | Chi et al. | |
| 5,198,695 A | 3/1993 | Hanes et al. | |
| 5,216,278 A | 6/1993 | Lin et al. | |
| 5,665,655 A * | 9/1997 | White | 438/584 |
| 5,770,468 A | 6/1998 | Kosaki | |
| 5,901,901 A | 5/1999 | Schneegans et al. | |
| 5,977,626 A * | 11/1999 | Wang et al. | 257/707 |
| 6,134,776 A | 10/2000 | Hoffmeyer | |
| 6,284,573 B1 | 9/2001 | Farnworth | |
| 6,391,770 B2 | 5/2002 | Kosaki et al. | |
| 6,717,267 B1 * | 4/2004 | Kunikiyo | 257/758 |
| 6,812,548 B2 * | 11/2004 | Dias et al. | 257/620 |
| 6,853,070 B2 * | 2/2005 | Khan et al. | 257/707 |
| 2002/0180064 A1 | 12/2002 | Hwan et al. | |
| 2003/0067057 A1 * | 4/2003 | Wu | 257/666 |
| 2003/0102526 A1 | 6/2003 | Dias et al. | |
| 2003/0183909 A1 | 10/2003 | Chiu | |

OTHER PUBLICATIONS

U.S. Appl. No. 2003/0104679, Dias et al. (Jun. 5, 2003).

* cited by examiner

*Primary Examiner*—Leonardo Andújar

(57) ABSTRACT

Integrated circuit systems with thermal dissipation enhancement features are described. In one aspect, an integrated circuit system includes a die incorporating an integrated circuit. The die has a top side and a bottom side. The top side supports an electrical signal communication metallization and a top side thermal dissipation metallization. The bottom side supports a bottom side thermal dissipation metallization.

21 Claims, 3 Drawing Sheets

THERMAL DISSIPATION IN INTEGRATED CIRCUIT SYSTEMS

BACKGROUND

Integrated circuits typically are formed from semiconductor chips or dice supporting respective electronic circuits. Integrated circuits typically are packaged in hermetically sealed or plastic molded packages to prevent environmental degradation that otherwise might be caused by, for example, humidity, contaminants, and electrically charged species. In addition, current trends in integrated circuit design are increasing device functionality and shrinking device size. These trends are leading to an increase in the power dissipation requirements of semiconductor dice. For this reason, integrated circuits typically are packaged on carrier structures (e.g., flexible polyimide carriers, glass reinforced epoxy carriers, and ceramic circuit carriers) that include heat dissipation features for cooling the integrated circuit dice mounted within the packages.

In one common power dissipation approach, an integrated circuit package includes a metal heat sink that is bonded or laminated to a circuit carrier. In some approaches, the bottom (or back) side of the integrated circuit die (i.e., the side that is free of any electrical signal connections) is attached to the metal heat sink with an epoxy-based adhesive, which may contain thermally conductive particles that increase the thermal conductivity between the integrated circuit chip and the heat sink. In other approaches, the bottom side of the integrated circuit die is attached to the circuit carrier surface at locations that are electrically and thermally connected to one or more heat spreading elements. In one integrated circuit system of this type, the heat spreading elements are thermal solder balls, which are attached to the bottom of the package. This system also includes a silicone-based layer that is screened onto the top face of a semiconductor die during packaging to increase thermal conduction between the electronic component and an overlying heat spreader.

SUMMARY

In one aspect, the invention features an integrated circuit system that includes a die incorporating an integrated circuit. The die has a top side and a bottom side. The top side supports an electrical signal communication metallization and a top side thermal dissipation metallization. The bottom side supports a bottom side thermal dissipation metallization.

In another aspect, the invention features a method of making an integrated circuit system. In accordance with this inventive method, multiple die regions each having an electrical signal communication metallization and a top side thermal dissipation metallization are formed on a top side of a substrate. A bottom side thermal dissipation metallization is formed on a bottom side of the substrate for each die region. The die regions are singulated to form respective integrated circuit dice.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

The embodiments described in detail below feature integrated circuit systems with thermal dissipation enhancement features that allow direct metallurgical bonds to be formed between the top and bottom sides of integrated circuit dice and heat spreading elements of an integrated circuit package. These metallurgical bonds simultaneously provide high thermal conductivity paths for heat emanating from the integrated circuit dice and robust attachments to the integrated circuit packages. In this way, these embodiments provide an effective way to remove heat from the integrated circuit dice and maintain the temperature of the integrated circuit dice within a reliable temperature range, while increasing the mechanical stability of the integrated circuit dice and increasing the overall robustness of the integrated circuit packages. In addition, these thermal dissipation enhancement features may be formed using substrate-scale (e.g., wafer-scale) processing, thereby increasing processing efficiency and allowing the integrated circuit dice to be packaged using standard automatic metallurgical bonding equipment.

Figure 1A:
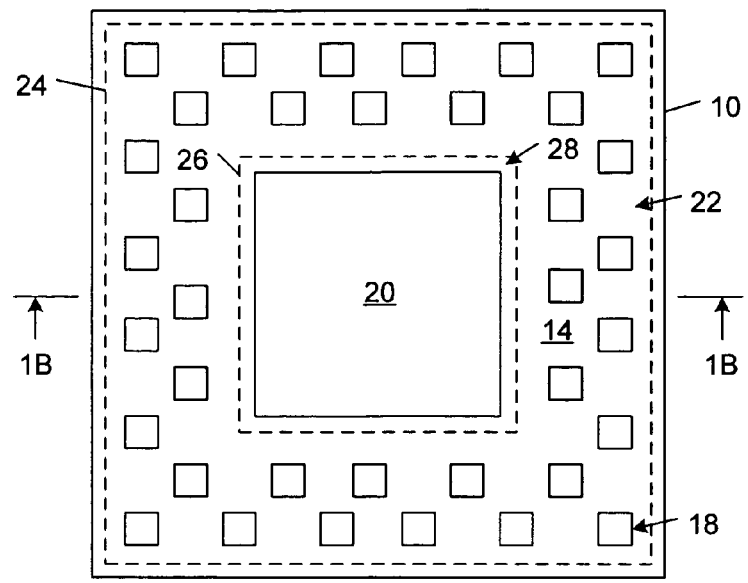
FIG. 1A is a diagrammatic top view of an embodiment of an integrated circuit die.
Figure 1B:
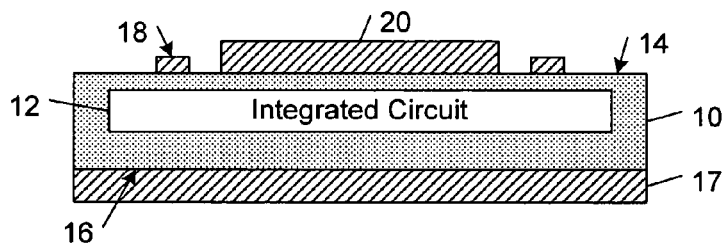
FIG. 1B is a diagrammatic cross-sectional side view of the integrated circuit die embodiment of FIG. 1A taken along the line 1B-1B.

FIGS. 1A and 1B show an embodiment of a die 10 that incorporates an integrated circuit 12. The term "die" refers to a substrate (usually part of a larger substrate) that contains an integrated circuit. The die 10 may be formed of any material that is suitable for supporting or containing integrated circuit 12. In some implementations, the die 10 is formed of a semiconductor material, such as silicon, gallium arsenide, or indium phosphide. As used herein, the term "integrated circuit" broadly refers to an electronic or optoelectronic component that is mountable on a substrate supporting one or more electrically conductive traces (or paths or channels), which are designed to carry electrical signals between the integrated circuit and one or more other electronic or optoelectronic components.

The die 10 has a top side 14 that supports an electrical signal communication metallization 18 and a top side thermal dissipation metallization 20. As used herein, the term "metallization" refers to single-layer metal film or a multi-layer metal film formed in or on an integrated circuit. In the embodiment illustrated in FIGS. 1A and 1B, the electrical signal communication metallization 18 includes a set of bonding elements defining the electrical contact areas on the die 10 for electrical wires, lines or traces carrying electrical signals (e.g., input/output signals) between the integrated circuit 12 and one or more external components or devices. The top side thermal dissipation metallization 20 defines a thermal contact area on the top side 14 of die 10 that provides a high thermal conductivity path from the die 10 to, for example, a heat spreader of a package into which die 10 will be mounted. The electrical signal communication metallization 18 and the top side thermal dissipation metallization 20 may be formed of the same or different materials. In some implementations, the electrical signal communication metallization 18 is formed of one of the following materials: gold, gold alloy, aluminum, and aluminum alloy. In one implementation, the top side thermal dissipation metallization 20 is formed of copper.

The die 10 also has a bottom side 16 that supports a bottom side thermal metallization 17. The bottom side thermal metallization 17 defines a thermal contact area on the bottom side 16 of the die 10 that provides a high thermal conductivity path from the die 10 to, for example, a heat spreader of a package into which die 10 will be mounted. In one implementation, the bottom side thermal dissipation metallization 17 is formed of copper.

As shown in FIG. 1A, in the illustrated embodiment, the bonding elements of the electrical signal communication metallization 18 are disposed on the top side 14 of die 10 in a peripheral region 22 located between the two square virtual boundaries 24, 26. This arrangement of the electrical signal communication metallization 18 conforms to standard layout specifications for typical wirebonded integrated circuit dies, allowing die 10 to be incorporated readily into existing integrated circuit fabrication processes. The top side thermal dissipation metallization 20 is disposed on the top side of die 10 within a central region 28 surrounded by the peripheral region 22.

Figure 2:
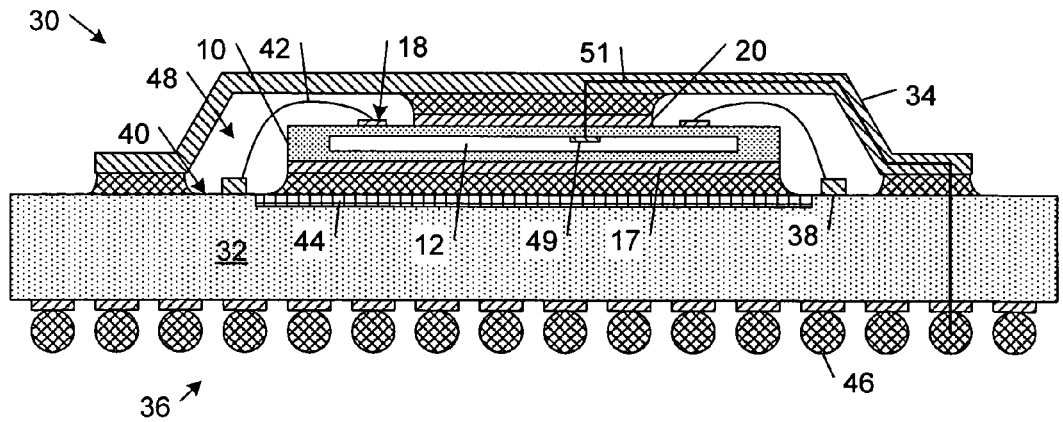
FIG. 2 is a diagrammatic cross-sectional side view of the integrated circuit die embodiment of FIG. 1A incorporated within an embodiment of an integrated circuit package.

FIG. 2 shows an embodiment of an exemplary package 30 into which die 10 may be mounted. The package 30 includes a carrier substrate 32, a lid 34, and an electrical interface 36. The carrier substrate 32 may be any type of single- or multi-layer substrate, including a printed circuit board (or printed wiring board) substrate, a glass substrate, and a ceramic substrate. The carrier substrate 32 includes a plurality of electrical wires, traces or channels leading from the electrical interface 36 to contact pads 38 on a die mounting surface 40. In the embodiment illustrated in FIG. 2, bond wires 42 connect the bonding elements of the electrical signal communication metallization 18 to respective contact pads 38 on the die mounting surface 40. The lid 34 may be mounted to the carrier substrate 32 using any type of suitable attachment method (e.g., an epoxy-based adhesive or a metallurgical bond, such as a solder bond).

The bottom side thermal dissipation metallization 17 may be metallurgically bonded directly to the carrier substrate 32, which then functions as a heat spreader. Alternatively, the bottom side thermal dissipation metallization 17 may be metallurgically bonded to a dedicated heat spreader 44, which is attached to the carrier substrate 32, as shown in FIG. 2. As used herein, the term "heat spreader" refers to any active or passive device or element designed to diffuse or dissipate heat. In one implementation, heat spreader 44 consists of a metal heat sink plate that is attached to the carrier substrate 32. The bottom side thermal dissipation metallization 17 is bonded metallurgically to the heat spreader 44 by a solder bonding process, such as surface mount technology (SMT) process. In alternative embodiments, bottom side thermal dissipation metallization 17 may be mounted to the carrier substrate using another mounting technique, such as, a bore soldering ("pin through-hole") mounting technique or a flip-chip mounting technique with an optional thermal compound backfill.

In the illustrated embodiment, the top side thermal dissipation metallization 20 is metallurgically bonded to the lid 34, which functions as a heat spreader. In this embodiment, the lid 34 is formed of a heat dissipation material, such as a metal (e.g., copper). In other embodiments, the top side thermal dissipation metallization 20 may be metallurgically bonded to a dedicated heat spreader that is attached to or incorporated within the lid 34.

In some embodiments, the enclosed space 48 between the lid 34 and the mounting surface 40 of the carrier substrate 32 is filled with an encapsulating material (e.g., an epoxy-based or a resin-based molding compound).

The metallurgical bonds between the top and bottom side thermal dissipation metallizations and the lid 34 and the heat spreader 44 simultaneously provide high thermal conductivity paths for heat emanating from the integrated circuit die 10 and robust attachments to the integrated circuit package. In this way, these bonds provide an effective way to remove heat from the integrated circuit die 10 and maintain the temperature of the integrated circuit die 10 within a reliable temperature range, while increasing the mechanical stability of the integrated circuit die 10 and increasing the overall robustness of the integrated circuit package 30.

In the embodiment illustrated in FIG. 2, the electrical interface 36 of package 30 includes a ball grid array, which includes an array of solder balls 46 that may be attached to corresponding contact pads on a component substrate (e.g., a printed circuit board) using, for example, SMT. In other embodiments, the electrical interface 36 may include different electrical elements that are compatible with a different package mounting technique, such as bore soldering ("pin through-hole") mounting technique or solder column bonding technique.

In some embodiments, one or more electrical contacts 49 of the integrated circuit embedded in die 10 may be connected electrically to one or more solder balls 46 by one or more electrical paths 51. Each electrical path 51 extends from the electrical contact 49, through the top side thermal dissipation metallization 20, through the metallurgical bond between the top side thermal dissipation metallization 20 and the lid 34, through the lid 34, through the bond between the lid 34 and the substrate 32, and through the substrate 32, to a solder ball 46. In some implementations of these embodiments, the electrical path 51 may be connected electrically to a source of power or ground potential.

Figure 3:
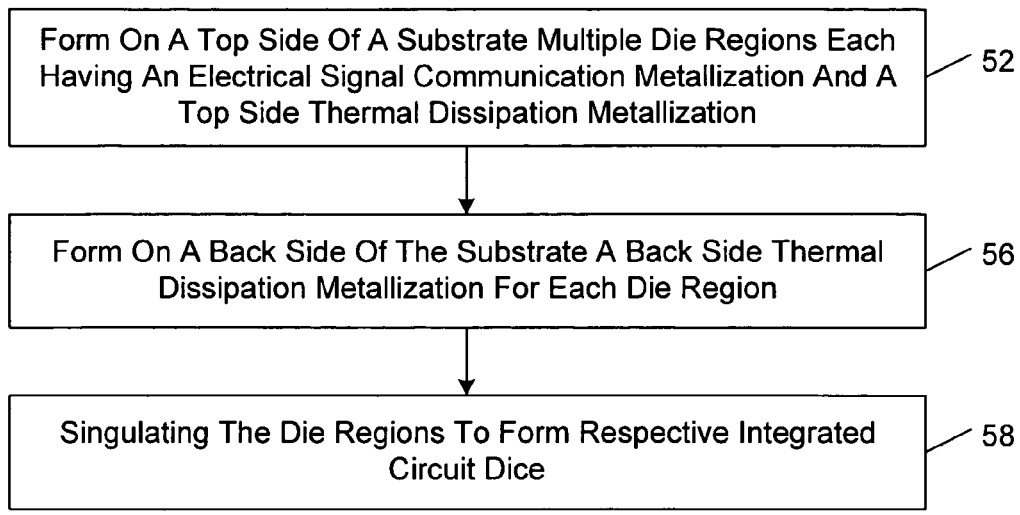
FIG. 3 is a flow diagram of an embodiment of a method of manufacturing the integrated circuit die embodiment of FIG. 1A.
Figure 4A:
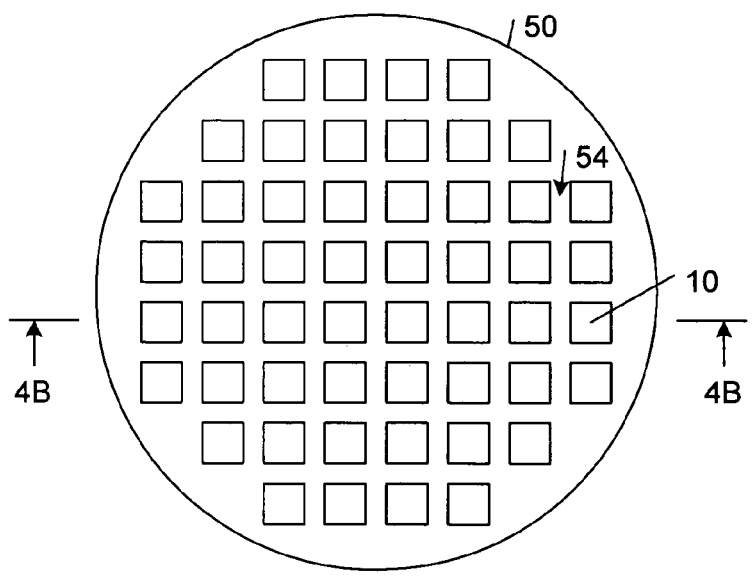
FIGS. 4A and 4B are diagrammatic top and side views of a substrate containing a plurality of die regions corresponding to the integrated circuit die embodiment of FIG. 1A.
Figure 4B:
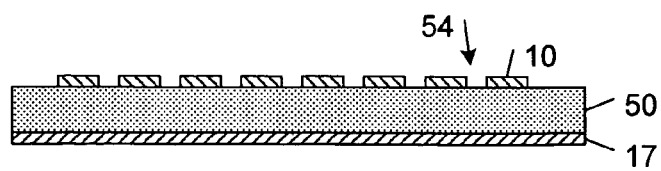

Referring to FIGS. 3, 4A and 4B, in one embodiment, die 10 is manufactured as follows. In accordance with this inventive method, multiple die regions 10 are formed on a top side of a substrate 50 (e.g., a semiconductor wafer) (block 52). The die regions 10 that are formed on substrate 50 are separated from one another by street areas 54. Each die region 10 has an electrical signal communication metallization 18 and a top side thermal dissipation metallization 20, as described in detail above. A bottom side thermal dissipation metallization 17 is formed on a bottom side of the substrate 50 for each die region (block 56). The bottom side thermal dissipation metallization 17 may be formed as a uniform layer or layers of metal that are deposited onto the bottom side of the substrate 50, as shown in FIG. 4B. Alternatively, the bottom side thermal dissipation metallization 17 may be patterned using, for example, photolithographic processing techniques. The die regions 10 are singulated to form respective integrated circuit dice (block 58).

Other embodiments are within the scope of the claims.

For example, in the embodiments described in detail above, the top side thermal dissipation metallization 20 consists of a single- or multi-layer film having a substantially uniform thickness. In other embodiments, the top side thermal dissipation metallization 20 may have a non-uniform thickness or it may be patterned. The top side thermal dissipation metallization pattern may be designed to reduce stress buildup in the integrated circuit die that might result from non-uniform heating effects or other causes.

Figure 5A:
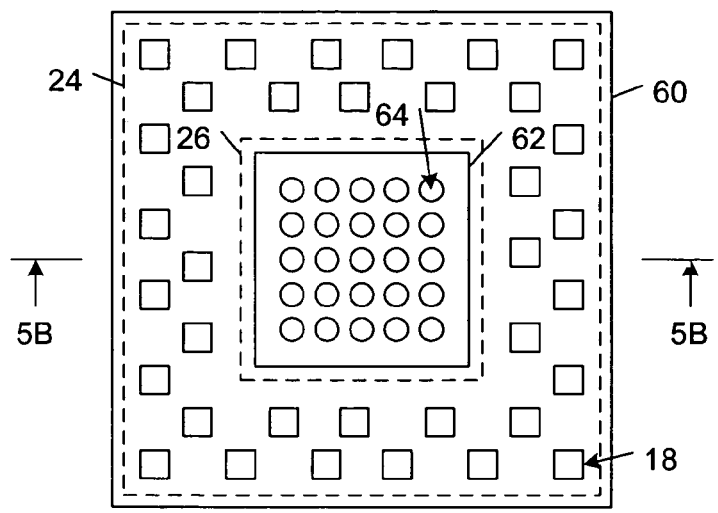
FIG. 5A is a diagrammatic top view of an embodiment of an integrated circuit die.
Figure 5B:
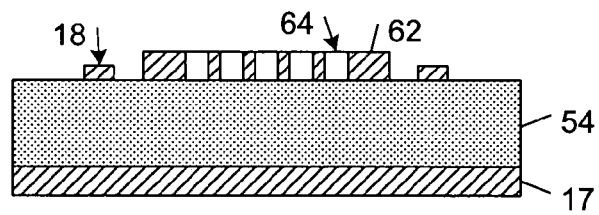
FIG. 5B is a diagrammatic cross-sectional side view of the integrated circuit die embodiment of FIG. 5A taken along the line 5B-5B.
Figure 6:
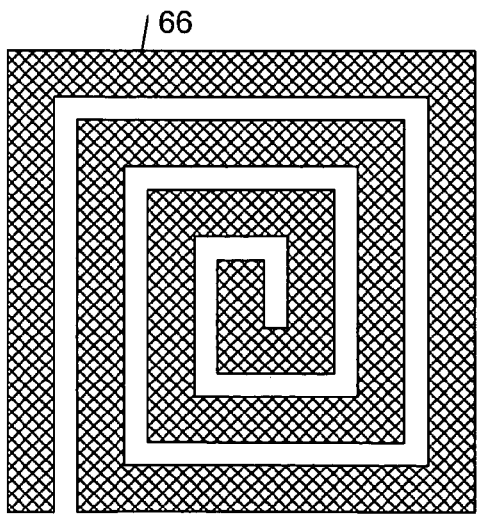
FIGS. 6 and 7 are diagrammatic top views of alternative top side thermal dissipation metallizations for different respective embodiments of integrated circuit dice.
Figure 7:
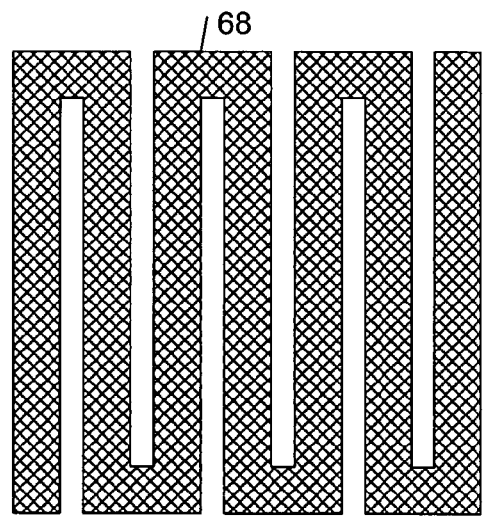

FIGS. 5A and 5B show an embodiment of an integrated circuit die 60 that includes a top side thermal dissipation metallization 62 that has an array of through-holes 64, which help to reduce stress buildup in the integrated circuit die 60. Other embodiments may include different top side thermal dissipation metallization patterns. For example, FIG. 6 shows an embodiment of a top side thermal dissipation metallization 66 that is patterned in to a rectangular spiral shaped path. FIG. 7 shows an alternative embodiment of a top side thermal dissipation metallization 68 that is patterned into a rectangular zigzag path. Other embodiments may include non-rectangular-shaped top side thermal dissipation metallization patterns. These patterns may conform to regular shapes, such as circular shapes or polygonal shapes, or arbitrary shapes.

Still other embodiments are within the scope of the claims.

What is claimed is:

1. An integrated circuit system, comprising:
a die incorporating an integrated circuit and having a top side and a bottom side, the top side supporting an electrical signal communication metallization and a top side thermal dissipation metallization, and the bottom side supporting a bottom side thermal dissipation metallization.

2. The system of claim 1, wherein the electrical signal communication metallization comprises a plurality of exposed bonding elements on the top side of the die.

3. The system of claim 2, wherein the bonding elements are contained in a peripheral region on the top side of the die.

4. The system of claim 3, wherein the top side thermal dissipation metallization is contained in a central region on the top side of the die.

5. The system of claim 4, wherein the top side thermal dissipation metallization is surrounded by the plurality of bonding elements.

6. The system of claim 1, wherein the electrical signal communication metallization surrounds the top side thermal dissipation metallization.

7. The system of claim 1, wherein the top side thermal dissipation metallization comprises a patterned metal layer.

8. The system of claim 7, wherein the patterned metal layer comprises at least one through-hole.

9. The system of claim 8, wherein the patterned metal layer comprises an array of through-holes.

10. The system of claim 1, further comprising a package comprising a top heat spreader metallurgically bonded to the top side thermal dissipation metallization of the die.

11. The system of claim 10, wherein the integrated circuit is connected electrically to the top side heat spreader by an electrical path extending through the top side thermal dissipation metallization.

12. The system of claim 10, wherein the package further comprises an electrical interface and a substrate containing a wiring interconnection between the electrical signal communication metallization and the electrical interface.

13. The system of claim 12, wherein the top heat spreader is mounted on the substrate and forms a lid of the package covering the top side of the die.

14. The system of claim 10, wherein the package further comprises a bottom heat spreader metallurgically bonded to the bottom side thermal dissipation metallization of the die.

15. A method of making an integrated circuit system, comprising:
forming on a top side of a substrate multiple die regions each having a top side supporting an exposed electrical signal communication metallization and an exposed top side thermal dissipation metallization;
forming on a bottom side of the substrate an exposed bottom side thermal dissipation metallization for each die region; and
singulating the die regions to form respective integrated circuit dice.

16. The method of claim 15, wherein, in each die region, the electrical signal communication metallization surrounds the top side thermal dissipation metallization.

17. The method of claim 15, wherein each top side thermal dissipation metallization comprises an exposed metal layer with an array of through-holes.

18. The method of claim 15, further comprising mounting each singulated die in a respective package having a top heat spreader, wherein mounting a singulated die comprises metallurgically bonding the top heat spreader of a package to the top side thermal dissipation metallization of the singulated die.

19. The method of claim 18, wherein the package additionally includes a substrate and mounting the singulated die further comprises mounting the package substrate to the bottom side thermal dissipation metallization of the singulated die.

20. The method of claim 18, wherein the top heat spreader is mounted on the substrate and forms a lid of the package, and further comprising encapsulating the die within the package with an encapsulating material.

21. The system of claim 1, wherein the electrical signal communication metallization is free of any direct electrical connection to the top side thermal dissipation metallization on the top side of the die.

* * * * *